(12) United States Patent
Scherle et al.

(10) Patent No.: US 7,760,327 B2
(45) Date of Patent: Jul. 20, 2010

(54) REFLECTING OPTICAL ELEMENT WITH ECCENTRIC OPTICAL PASSAGEWAY

(75) Inventors: Hans-Jürgen Scherle, Aalen (DE); Yim-Bun Patrick Kwan, Aalen (DE); Stefan Xalter, Oberkochen (DE); Johannes Lippert, Buch Am Wald (DE); Ulrich Weber, Ulm (DE); Bernhard Geuppert, Lauchheim (DE); Bernhard Gellrich, Aalen (DE); Jens Kugler, Heubach (DE); Franz Sorg, Oberkochen (DE); Willi Heintel, Aalen (DE); Harald Kirchner, München (DE); Wolfgang Keller, Erbach (DE); Andreas Frommeyer, Aalen (DE); Fraser G. Morrison, Trinity Edingburgh (GB)

(73) Assignee: Carl Zeiss SMT AG, Oberkochen (DE)

( * ) Notice: Subject to any disclaimer, the term of this patent is extended or adjusted under 35 U.S.C. 154(b) by 1024 days.

(21) Appl. No.: 11/395,719

(22) Filed: Mar. 31, 2006

(65) Prior Publication Data
US 2006/0262704 A1    Nov. 23, 2006

Related U.S. Application Data

(63) Continuation-in-part of application No. PCT/EP03/13606, filed on Dec. 3, 2003, and a continuation-in-part of application No. PCT/EP2005/005600, filed on May 24, 2005.

(30) Foreign Application Priority Data

Oct. 2, 2003 (DE) ................. 103 46 046
May 24, 2004 (DE) ............ 10 2004 025 832

(51) Int. Cl.
*G03B 27/42* (2006.01)
*G03B 27/54* (2006.01)
*G03B 27/32* (2006.01)
*G02B 5/10* (2006.01)

(52) U.S. Cl. ................ 355/53; 355/67; 355/77; 359/850; 359/853

(58) Field of Classification Search ............ 355/53, 355/67, 77; 359/850, 851, 853, 857, 858
See application file for complete search history.

(56) References Cited

U.S. PATENT DOCUMENTS

| 5,153,898 A | 10/1992 | Suzuki et al. ............ 378/34 |
| 5,488,514 A | 1/1996 | Bruning et al. ........... 359/811 |

(Continued)

FOREIGN PATENT DOCUMENTS

DE    100 30 005 A1    12/2001

(Continued)

*Primary Examiner*—Alan A Mathews
(74) *Attorney, Agent, or Firm*—Ohlandt, Greeley, Ruggiero & Perle, L.L.P.

(57) ABSTRACT

There is provided an optical element comprising an optical element body, a reflecting area and an optical passageway. The optical element body defines an axis of rotational symmetry. The reflecting area is disposed on the optical element body and adapted to be optically used in an exposure process. The optical passageway is arranged within the optical element body and allows light to pass the optical element body, the optical passageway being arranged eccentrically with respect to the axis of rotational symmetry.

55 Claims, 5 Drawing Sheets

U.S. PATENT DOCUMENTS

| | | |
|---|---|---|
| 6,549,270 B1 * | 4/2003 | Ota .............................. 355/55 |
| 6,757,051 B2 | 6/2004 | Takahashi et al. ............. 355/67 |
| 7,006,194 B2 * | 2/2006 | Sumiyoshi et al. ............ 355/30 |
| 2002/0163741 A1 * | 11/2002 | Shibazaki ................... 359/819 |

FOREIGN PATENT DOCUMENTS

| | | |
|---|---|---|
| DE | 102 26 655 A1 | 1/2004 |
| EP | 0 230 277 A2 | 7/1987 |
| EP | 1 168 028 A2 | 1/2002 |
| EP | 1 253 601 A2 | 10/2002 |
| EP | 1 312 965 A1 | 5/2003 |
| JP | 8-5807 | 12/1996 |
| JP | 2002-131605 | 5/2002 |
| WO | WO 02/16993 A1 | 2/2002 |

* cited by examiner

REFLECTING OPTICAL ELEMENT WITH ECCENTRIC OPTICAL PASSAGEWAY

CROSS-REFERENCE TO RELATED APPLICATIONS

The present application is (a) a continuation-in part of International Patent Application Serial No. PCT/EP2003/013606, filed Dec. 3, 2003, and (b) a continuation-in-part of International Patent Application Serial No. PCT/EP2005/005600, filed May 24, 2005.

The present application is also claiming priority of German Patent Application No. 103 46 046, filed Oct. 2, 2003, and German Patent Application No. 10 2004 025 832, filed May 24, 2004.

The entire content of the four aforementioned applications is herein incorporated by reference.

BACKGROUND OF THE INVENTION

The invention relates to optical elements and optical element units used in exposure processes, in particular to optical elements and optical element units used in microlithography systems. It further relates to methods of manufacturing and of supporting an optical element of such an optical element arrangement. It also relates to optical imaging methods for transferring an image of a pattern onto a substrate. The invention may be used in the context of photolithography processes for fabricating microelectronic devices, in particular semiconductor devices, or in the context of fabricating devices, such as masks or reticles, used during such photolithography processes.

Typically, the optical systems used in the context of fabricating microelectronic devices such as semiconductor devices comprise a plurality of optical element units comprising optical elements, such as lenses, mirrors, gratings etc., in the light path of the optical system. Those optical elements usually cooperate in an exposure process to illuminate a pattern formed on a mask, reticle or the like and to transfer an image of this pattern onto a substrate such as a wafer. The optical elements are usually combined in one or more functionally distinct optical element groups that may be held within distinct optical element units.

With refractive systems, typically, such optical element units are often built from a stack of optical element modules holding one or more rotationally symmetric optical elements. These optical element modules usually comprise an external generally ring shaped support device supporting one or more optical element holders each, in turn, holding one or more optical elements.

In mainly reflective systems, such as the ones adapted for a use exposure light in the extreme UV (EUV) range, but also in catadioptric systems as they are known for example from U.S. Pat. No. 6,757,051 B1 (Takahashi et al.), the disclosure of which is included herein by reference, it is often necessary to provide optical elements with reflective areas or reflective surfaces used in the exposure process that deviate from rotational symmetry. This deviation from rotational symmetry often results from a design where the reflective area of a mirror used in an exposure process is only a fraction of an originally rotationally symmetric mirror surface, such as a spherical mirror surface segment cut from a spherical mirror surface. This spherical mirror surface segment may then be non-rotationally-symmetric in itself. In order to provide a compact design, typically, the mirror only has a design, in particular a size, that is sufficient to provide the reflective area of the mirror that is needed and used in the exposure process.

Often such a minimum size design is also due to the fact that the exposure light has to pass on the outside of the mirror first to reach a second mirror reflecting the exposure light back onto the mirror surface. Here, the minimum size design is intended to avoid obstruction of the path of the exposure light towards the second mirror.

Due to the ongoing miniaturization of semiconductor devices there is a permanent need for enhanced resolution of the optical systems used for fabricating those semiconductor devices. This need for enhanced resolution obviously pushes the need for an increased imaging accuracy of the optical system. Furthermore, to reliably obtain high-quality semiconductor devices it is not only necessary to provide an optical system showing a high degree of imaging accuracy. It is also necessary to maintain such a high degree of accuracy throughout the entire exposure process and over the lifetime of the system. As a consequence, the components of the optical system co-operating in the exposure process must be supported in a defined manner in order to provide and maintain a predetermined spatial relationship between said optical system components which, in turn, guarantees a high quality exposure process.

A problem that arises especially with the above optical elements having reflective areas or reflective surfaces deviating from rotational symmetry is to provide support to the optical element without introducing excessive stresses and, thus, deformations into the optical element which otherwise would deteriorate the imaging accuracy. Typically, such optical elements having reflective areas or reflective surfaces deviating from rotational symmetry have a non-rotationally-symmetric optical element body that requires additional effort when being supported in order to avoid the introduction of deformations throughout the entire exposure process and over the lifetime of the system.

On the other hand, if the above a minimum size design is avoided by using rotationally symmetric mirrors, even support to the mirror may be provided at its circumference without introducing excessively uneven stresses and, thus, distortions into the optical element. However, this rotationally symmetric design of the mirrors has the disadvantage that they require more space, not only for the respective mirror itself but also for the light that has to pass the respective mirror on its outside, leading to a less compact design.

SUMMARY OF THE INVENTION

It is thus an object of the invention to, at least to some extent, overcome the above disadvantages and to provide good and long term reliable imaging properties of a compact optical system used in an exposure process.

It is a further object of the invention to reduce the effort necessary for an optical system used in an exposure process while at least maintaining the imaging accuracy of the optical system used in an exposure process.

It is a further object of the invention to reduce the effort necessary for supporting an optical element having a reflective area used in an exposure process and deviating from rotational symmetry.

These objects are achieved according to the invention which is based on the teaching that a reduction of the effort necessary for a support avoiding introduction of excessive stresses and, thus, deformations into an optical element having a reflective area used in an exposure process is possible by providing an optical element with an optical element body that is, in itself, rotationally symmetric with respect to an axis of rotational symmetry and to provide this optical element body with an optical passageway that allows light to pass the optical element body and is arranged eccentrically with respect to the axis of rotational symmetry of the optical element body.

Thus, a very compact arrangement with an optical element may be achieved that allows passage of the exposure light via the optical passageway but—eventually apart from the optical passageway—still has a substantially rotationally symmetric optical element body that allows simple stress and deformation minimized support.

It will be appreciated that, in the sense of the invention, rotational symmetry of the optical element body relates at least to the part of the optical element body including the area defining the reflective area optically used in an exposure process. At least this part defines the axis of rotational symmetry. Preferably, it also relates to the overall basic shape of the optical element body. However, it will be appreciated that in the region of auxiliary parts of the optical element body, such as connecting parts providing connection to a support structure, a deviation from the rotational symmetry may be provided. Here, preferably, an even distribution of auxiliary parts is provided to reduce the disturbance of the rotational symmetry to the least possible extent. It will be appreciated that, in the sense of the invention, the term rotational symmetry (and related terms) is to be understood as including any geometry that may be transformed substantially into itself by a rotation of less than 360° about the first housing axis.

Thus, according to a first aspect of the invention there is provided an optical element comprising an optical element body, a reflecting area and an optical passageway.

The optical element body defines an axis of rotational symmetry. The reflecting area is disposed on the optical element body and adapted to be optically used in an exposure process. The optical passageway is arranged within the optical element body and allows light to pass the optical element body, the optical passageway being arranged eccentrically with respect to the axis of rotational symmetry.

According to a second aspect of the invention there is provided an optical element unit comprising at least one optical element and a support structure supporting the at least one optical element. The at least one optical element comprises an optical element body, a reflecting area and an optical passageway, the optical element body defining an axis of rotational symmetry, the reflecting area being disposed on the optical element body and adapted to be optically used in an exposure process, the optical passageway being arranged within the optical element body and allowing light to pass the optical element body and being arranged eccentrically with respect to the axis of rotational symmetry.

According to a third aspect of the invention there is provided an optical imaging arrangement comprising a mask unit adapted to receive a pattern, a substrate unit adapted to receive a substrate and an optical projection unit adapted to transfer an image of the pattern onto the substrate. The optical projection unit comprising at least one optical element and a support structure supporting the at least one optical element; the at least one optical element comprising an optical element body, a reflecting area and an optical passageway, the optical element body defining an axis of rotational symmetry, the reflecting area being disposed on the optical element body and adapted to be optically used in an exposure process, the optical passageway being arranged within the optical element body and allowing light to pass the optical element body and being arranged eccentrically with respect to the axis of rotational symmetry.

According to a fourth aspect of the invention there is provided a method of manufacturing an optical element comprising providing an optical element body, the optical element body defining an axis of rotational symmetry and forming a reflecting area of the optical element body, the reflecting area being adapted to be optically used in an exposure process, and forming an optical passageway, the optical passageway being arranged within the optical element body and allowing light to pass the optical element body, the optical passageway being formed eccentrically with respect to the axis of rotational symmetry.

According to a fifth aspect of the invention there is provided a method of supporting an optical element comprising providing an optical element having an optical element body, a reflecting area, an optical passageway and at least one connecting member, the optical element body defining an axis of rotational symmetry, the reflecting area being adapted to be optically used in an exposure process, the optical passageway being arranged within the optical element body and allowing light to pass the optical element body, and the optical passageway being formed eccentrically with respect to the axis of rotational symmetry, and supporting the optical element via the at least one connecting member on a support structure.

According to a sixth aspect of the invention there is provided an optical imaging method comprising providing a pattern, a substrate and an optical projection unit adapted to transfer an image of the pattern onto the substrate, the optical projection unit comprising at least one optical element, the at least one optical element having an optical element body, a reflecting area, an optical passageway and at least one connecting member, the optical element body defining an axis of rotational symmetry, the reflecting area being adapted to be optically used when transferring the image of the pattern onto the substrate, the optical passageway being arranged within the optical element body and allowing light to pass the optical element body, and the optical passageway being formed eccentrically with respect to the axis of rotational symmetry, and using the optical projection unit to transfer the image of the pattern onto the substrate.

According to a seventh aspect of the invention there is provided an optical imaging method comprising providing a pattern, a substrate and an optical projection unit adapted to transfer an image of the pattern onto the substrate, and using a light beam to transfer the image of the pattern onto the substrate. The using the light beam comprises directing the light beam onto an eccentric first reflecting area of a first optical element of the optical projection unit, the first reflecting area reflecting the light beam onto an eccentric second reflecting area of a second optical element of the optical projection unit.

According to an eighth aspect of the invention there is provided an optical element unit comprising a first optical element, a second optical element and a support structure supporting the first optical element adjacent to the second optical element. The first optical element comprises a first optical element body, a first reflecting area and a first optical passageway. The second optical element comprises a second optical element body, a second reflecting area and a second optical passageway. The first optical element body defines a first axis of rotational symmetry while the second optical element body defines a second axis of rotational symmetry. The first reflecting area is disposed on the first optical element body and adapted to be optically used in an exposure process while the second reflecting area is disposed on the second optical element body and adapted to be optically used in the exposure process. The first optical passageway is arranged within the first optical element body and allows light to pass the first optical element body while the second optical passageway is arranged within the second optical element body and allows light to pass the second optical element body. The first optical passageway is arranged eccentrically with respect to the first axis of rotational symmetry while the second optical passageway is arranged eccentrically with respect to the second axis of rotational symmetry.

According to a ninth aspect of the invention there is provided an optical element unit comprising a first optical element, a second optical element and a support structure. The first optical element comprises a first reflecting area and an eccentric first optical passageway while the second optical element comprises a second reflecting area and an eccentric second optical passageway. The support structure supports the first optical element adjacent to the second optical element such that the first reflecting area faces the second reflecting area with an intermediate space being formed between the first optical element and the second optical element. The support structure supports the first optical element via first connectors and the second optical element via second connectors such that the first connectors and the second connectors define mutually penetrating first and second installation spaces. The first optical passageway allows light to enter the intermediate space and the second optical passageway allows light to leave the intermediate space.

Further aspects and embodiments of the invention will become apparent from the dependent claims and the following description of preferred embodiments which refers to the appended figures. All combinations of the features disclosed, whether explicitly recited in the claims or not, are within the scope of the invention.

DETAILED DESCRIPTION OF THE INVENTION

In the following, a preferred embodiment of an optical imaging arrangement 101 according to the invention will be described with reference to FIGS. 1 to 3.

Figure 1:
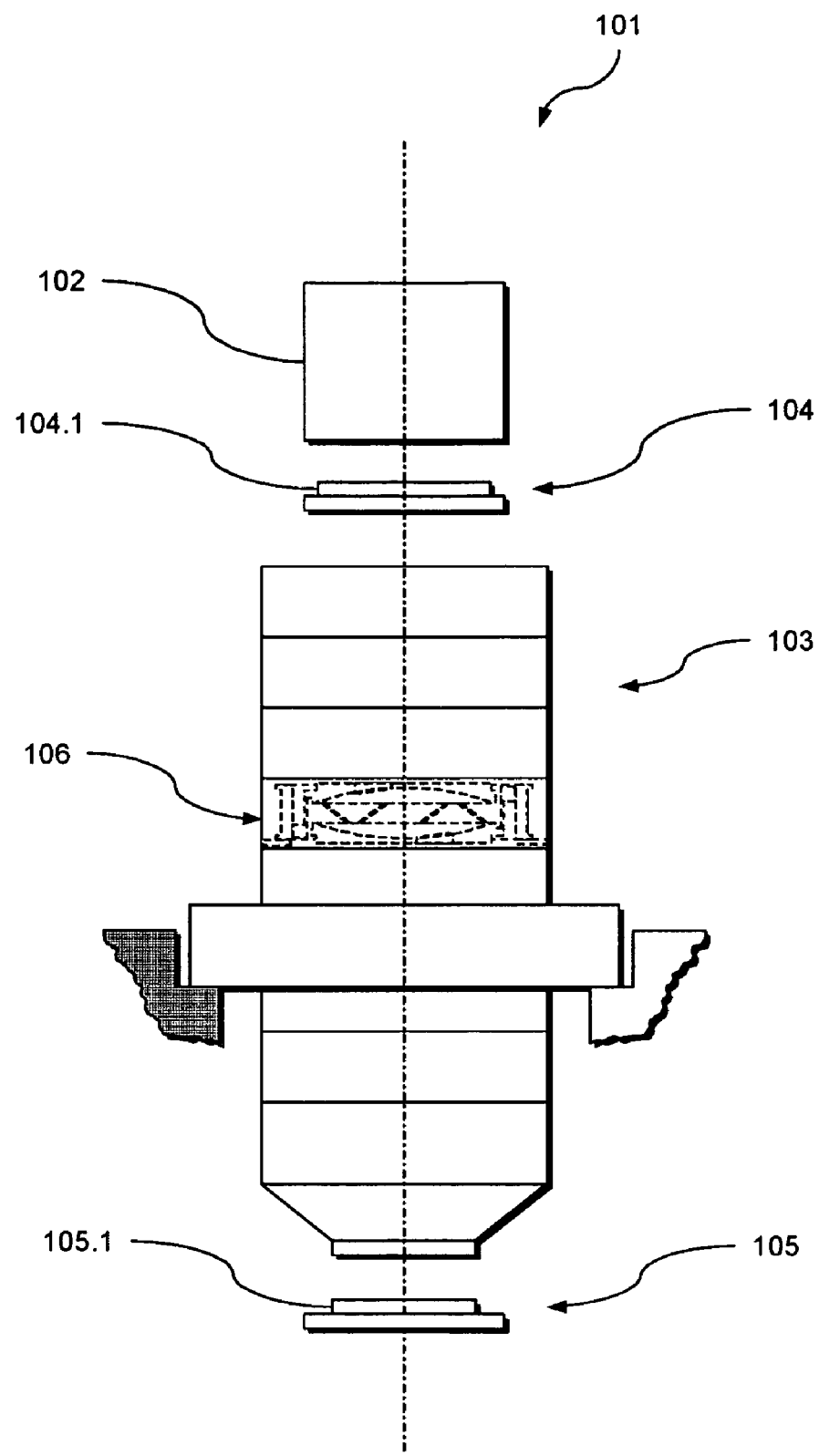
FIG. 1 is a schematic representation of a preferred embodiment of an optical imaging arrangement according to the invention which comprises an optical element unit with an optical element according to the invention and with which preferred embodiments of methods according to the invention may be executed.

FIG. 1 is a schematic and not-to-scale representation of the optical imaging arrangement in the form of an optical exposure apparatus 101. The optical exposure apparatus 101 comprises an illumination unit 102 and an optical projection unit 103 adapted to transfer, in an exposure process, an image of a pattern formed on a mask 104.1 of a mask unit 104 onto a substrate 105.1 of a substrate unit 105. To this end, the illumination unit 102 illuminates the mask 104.1. The optical projection unit 103 receives the light coming from the mask 104.1 and projects the image of the pattern formed on the mask 104.1 onto the substrate 105.1, e.g. a wafer or the like.

The optical projection unit 103 comprises a catadioptric optical element system including a plurality of refractive elements, such as lenses or the like, and a plurality of reflective elements, such as mirrors or the like. The optical element system is held by a stack of optical element units including an optical element unit 106 according to the invention with a first optical element 107 and a second optical element 108 according to the invention.

Figure 2:
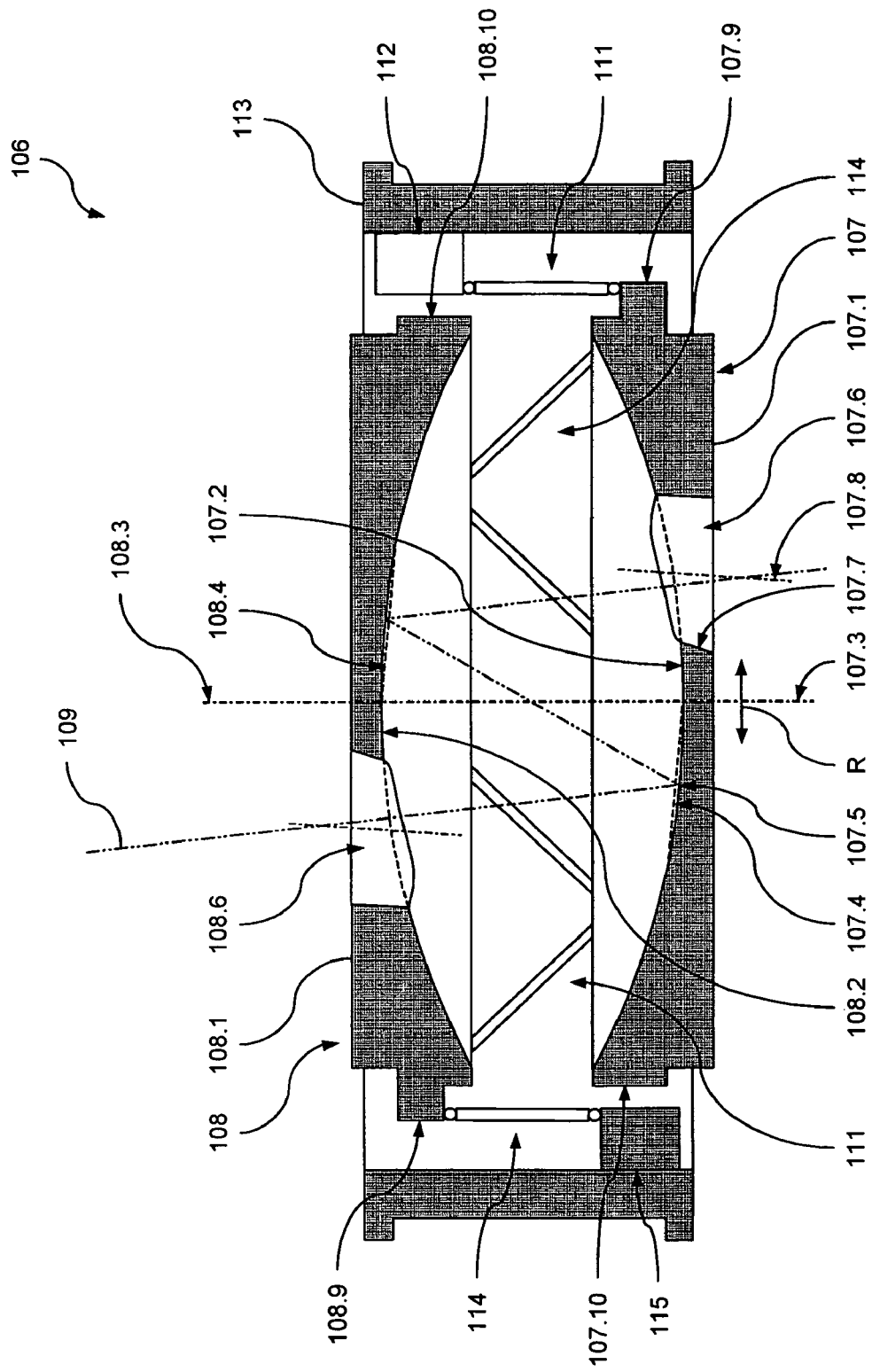
FIG. 2 is a schematic sectional representation of an optical element unit of the optical imaging arrangement of FIG. 1.
Figure 3:
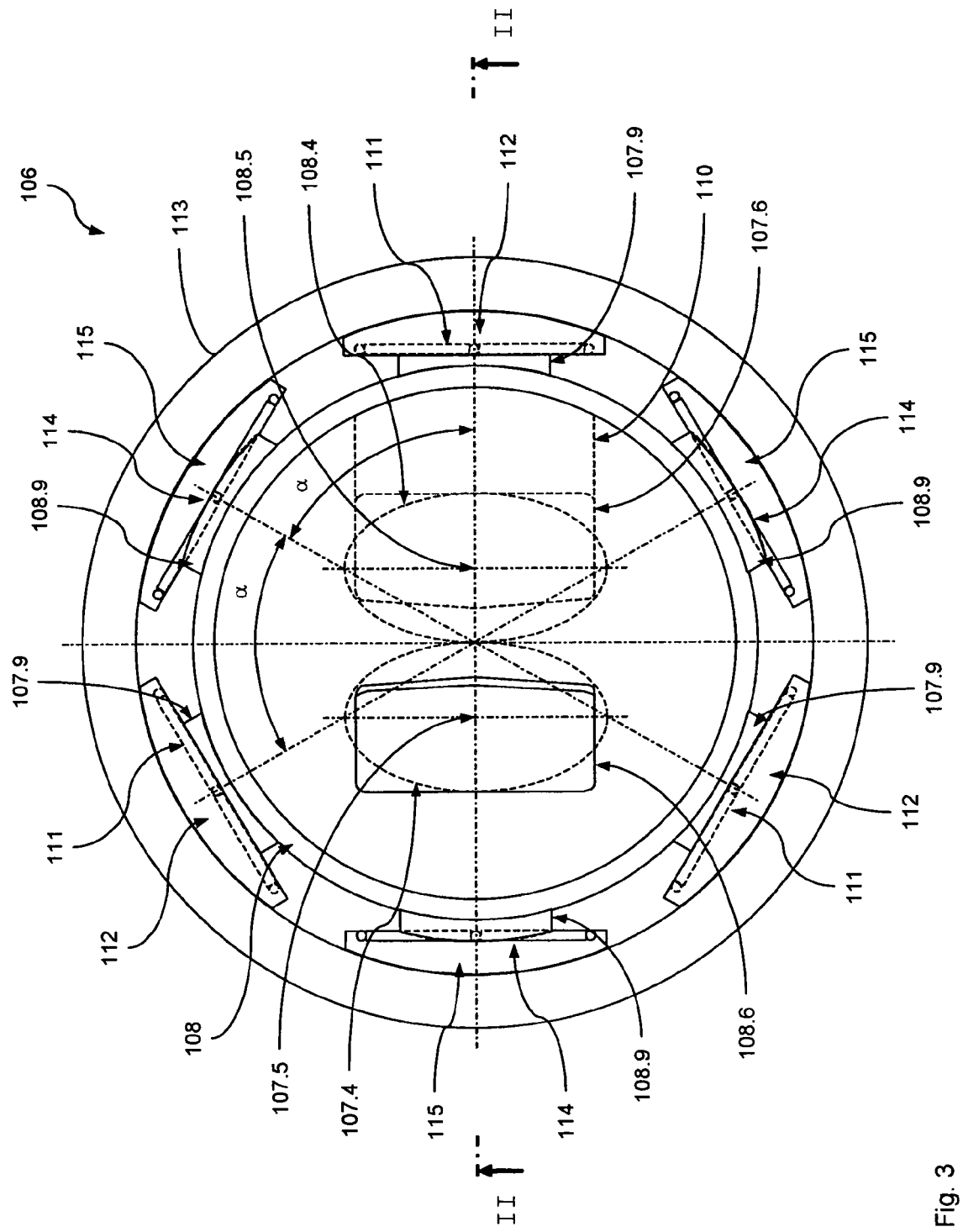
FIG. 3 is a schematic top view of a the optical element unit of FIG. 2.
Figure 4:
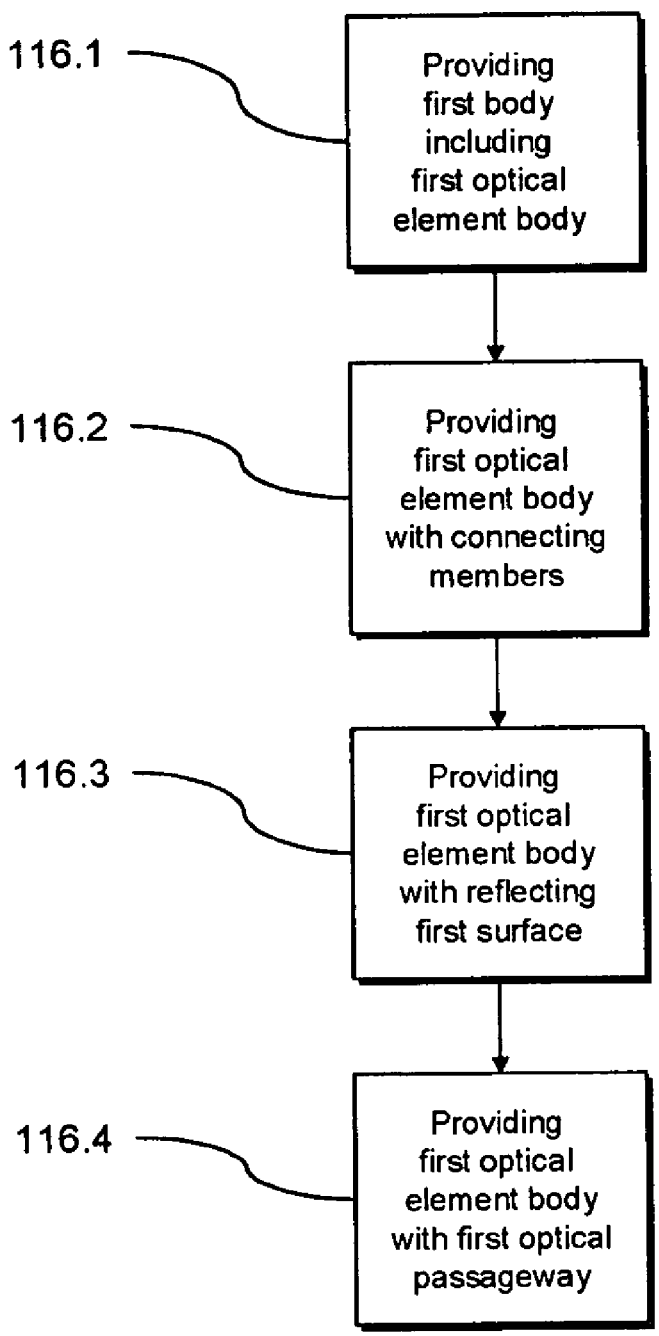
FIG. 4 is a block diagram of a preferred embodiment of a method of manufacturing an optical element according to the invention for use in the optical imaging arrangement of FIG. 1.
Figure 5:
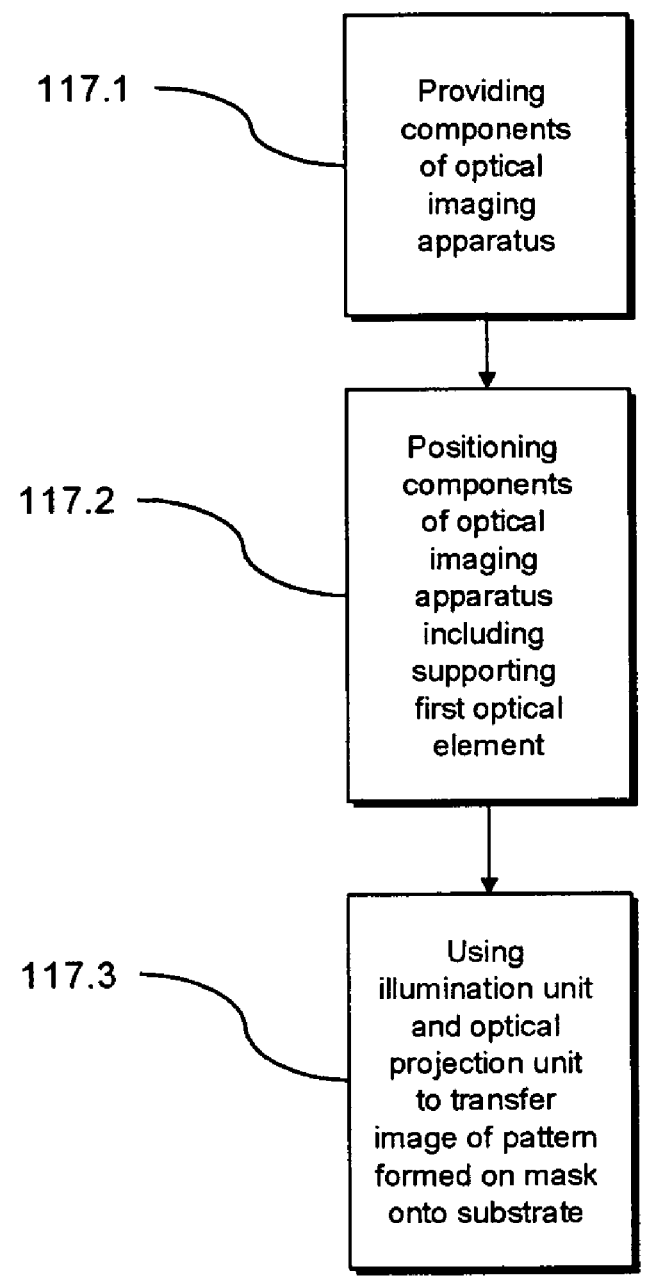
FIG. 5 is a block diagram of a preferred embodiment of an optical imaging method according to the invention comprising a method of supporting an optical element which may be executed with the optical imaging arrangement of FIG. 1.

FIGS. 2 and 3 show a schematic and not-to-scale sectional view and a top view, respectively, of the optical element unit 106. As can be seen from FIGS. 2 and 3, the first optical element 107 has a substantially rotationally symmetric first optical element body 107.1 with a spherical first surface 107.2 that defines a first axis 107.3 of rotational symmetry. The first optical element body 107.1 defines a radial direction R and a plane of main extension that are both substantially perpendicular to the first axis 107.3 of rotational symmetry.

The spherical first surface 107.2 is a coherent reflecting surface forming a reflecting section of the first optical element body 107.1. The reflecting first surface 107.2 has a first reflecting area 107.4 optically used in the exposure process transferring the image of the pattern formed on the mask 104.1 onto the substrate 105.1. The first reflecting area 107.4 defines a first reflecting area center 107.5 that is arranged eccentrically with respect to the first axis 107.3 of rotational symmetry of the first optical element 107. In other words, the first reflecting area center 107.5 is radially offset (i.e. offset in the radial direction R) with respect to the first axis 107.3 of rotational symmetry of the first optical element 107. The first reflecting area center 107.5 may for example be defined by the center of area of the first reflecting area 107.4.

As mentioned above, the first reflecting area 107.4 is part of the reflecting first surface 107.2. However, it will be appreciated that, with other embodiments of the invention, only the first reflecting area may show an appropriate degree of reflection while the rest of the first surface of the optical element body may be less reflecting or even non-reflecting. For example, the optical element body may show a correspondingly reflecting surface layer or the like only within the first reflecting area.

It will be further appreciated that the reflecting area may be formed by any suitable means, e.g. a corresponding design of the optical element body in itself or a coating of the optical element body with one or more layers-providing the reflecting properties appropriate for the wavelength of the exposure light used in the exposure process.

The first optical element further comprises a first optical passageway 107.6 arranged within the first optical element body 107.1. The first optical passageway 107.6 allows the exposure light—represented in FIG. 2 by the light beam 109—used in the exposure process to pass or traverse, respectively, the first optical element 107. To this end the first optical passageway 107.6 is formed by a first recess in the form of a first hole in the first optical element body.

The first optical passageway formed by the first hole 107.6 is confined by a continuous circumferential side wall 107.7 formed within the first-optical element body 107.1. However, it will be appreciated that, with other embodiments of the invention, the first optical passageway may also reach radially (i.e. in the radial direction R) through the outer circumference of the optical element body such that, e.g. a slot like, opening is also formed within the outer circumference of the optical element body as it is indicated in FIG. 3 by the dashed contour 110. Furthermore, it will be appreciated that the first optical passageway may have any other cross-section suitable for the respective application.

The first optical passageway 107.6 has a first central passageway axis 107.8 that is arranged radially offset (i.e. offset in the radial direction R) and inclined with respect to the first axis 107.3 of rotational symmetry of the first optical element 107. In other words, the first optical passageway formed by the first hole 107.6 is also arranged eccentrically with respect to the first axis 107.3 of rotational symmetry of the first optical element 107.

In the embodiment shown, the first optical passageway 107.6 does not intersect with the first axis 107.3 of rotational symmetry of the first optical element 107. However, it will be appreciated that, with other embodiments of the invention, the first optical passageway may also intersect with the first axis of rotational symmetry of the first optical element. In other words, the eccentrically arranged first optical passageway may also reach into the area of the center of the first optical element.

As mentioned above, the first optical passageway 107.6 is formed by a recess within the first optical element body 107.1. This has the advantage that the light beam 109 is not influenced by the optical element body 107.1 when traversing it. However, it will be appreciated that, with other embodiments of the invention, the first optical passageway may also be formed by a section of the first optical element body that is transparent to the exposure light used. For example, in a modification of the first optical element shown in FIGS. 2 and 3, the first optical element body may be made from a lens material that is transparent to the exposure light used. The reflecting first surface with the first reflecting area may be formed by a reflecting coating of the first optical element body that is missing in the area of the first optical passageway to allow the exposure light to traverse the first optical passageway.

It will be further appreciated that the first reflecting area 107.4 used in the exposure process, despite of being part of the basically rotationally symmetric first surface 107.2, in itself is not rotationally symmetric and, thus, in other words deviates from rotational symmetry. However, with the design according to the invention, despite the non-rotationally-symmetric first reflecting area 107.4, a first optical element 107 is achieved that, on the one hand, due to the substantially rotationally symmetric first optical element body 107.1, may be supported in a simple and conventional manner of a rotationally symmetric optical element.

On the other hand, the eccentric first optical passageway 107.6, while not deteriorating the structural rigidity of the first optical element 107, allows for a very compact design of the optical element unit 106. This is due to the fact that no sumptuous beam guiding system or the like is necessary for guiding the beam 109 reflected by the first optical element 107 again past the first optical element 107. For example, as shown in FIG. 2, the beam 109 may simply be reflected a second time by an adjacent optical element, here the adjacent second optical element 108, and traverse the first optical element 107 via the first optical passageway 107.6.

To achieve a simple statically determinate support to the first optical element 107, three connecting members in the form of radial protrusions 107.9 are monolithically connected to the first optical element body 107.1 at the outer circumference 107.10 of the first optical element body 107.1. As can be seen from FIG. 3, the radial protrusions 107.9 are of identical design and mutually rotated about the first axis 107.3 of symmetry by an angle 2α=120° such that they are equiangularly distributed at the outer circumference 107.10 of the first optical element body 107.1. However, it will be appreciated that, with other embodiments of the invention any other suitable angle of rotation may be chosen between the radial protrusions. Each radial protrusion 107.9 is connected to a connector in the form of a bipod 111 by which the first optical element 107 is supported via a console 112 on a support structure in the form a support ring 113 of the optical element unit 106.

It will be appreciated that the bipods 111—that are illustrated in a highly simplified manner in FIGS. 2 and 3—may be used for actively and/or passively positioning the first optical element 107 in up to six degrees of freedom. Furthermore, it will be appreciated that instead of the bipods 111, any other suitable connector structures may be provided to support the first optical element.

It will be further appreciated that the eccentric first optical passageway 107.6, in an advantageous manner, does not interrupt the outer circumference 107.10 of the first optical element body 107.1. As a consequence, the first optical passageway 107.6 does not deteriorate the structural rigidity of the first optical element 107. This leads to a substantially rigid first optical element 107 that has a shape comparable to conventional rotationally symmetric optical elements and shows a comparatively low sensitivity to stress induced deformation that might be introduced via its support structure 111 to 113 and might deteriorate the imaging accuracy.

The second optical element 108 of the optical element unit 106 is arranged adjacent to the first optical element 107 and of identical design with the first optical element 107 such that it is here mainly referred to the explanations given above in the context of the first optical element 107.

The first optical element 107 and the second optical element 108 form immediately consecutive optical elements along the light beam path of the light beam 109. The second optical element 108 is arranged such that the first axis 107.3 of rotational symmetry of the first optical element body 107.1 and the second axis 108.3 of rotational symmetry of the second optical element body 108.1 are substantially collinear forming part of an optical axis of the optical element unit. Furthermore, the second optical element 108 is arranged such that the light beam 109 coming from the mask 104.1 first traverses the second optical passageway 108.6 that is arranged eccentrically with respect to the second axis 108.3 of rotational symmetry of the second optical element body 108.1 and formed as a hole within the second optical element body 108.1.

After traversing the second optical passageway 108.6, the light beam 109 hits the first reflecting area 107.4 of the first optical element 107 and is reflected by the latter towards the second optical element 108. The light beam 109 then hits the eccentric second reflecting area 108.4 of the second optical element 108 and is reflected by the latter towards the first optical element 107. Finally, the light beam 109 traverses the first optical passageway 107.6 of the first optical element before it further propagates through the optical projection unit towards the substrate 105.1.

To achieve a simple statically determinate support to the second optical element 108, three connecting members in the form of radial protrusions 108.9 are monolithically connected to the second optical element body 108.1 at the outer circumference 108.10 of the second optical element body 108.1. As can be seen from FIG. 3, the radial protrusions 108.9 are of identical design and mutually rotated about the second axis 108.3 of symmetry by an angle 2α=120° such that they are equiangularly distributed at the outer circumference 108.10 of the second optical element body 108.1. However, it will be appreciated that, with other embodiments of the invention any other suitable angle of rotation may be chosen between the radial protrusions. Each radial protrusion 108.9 is connected to a connector in the form of a bipod 115 by which the second optical element 108 is supported via a console 115 on the support ring 113 of the optical element unit 106.

It will be appreciated that the bipods 114—that are illustrated in a highly simplified manner in FIGS. 2 and 3—may be used for actively and/or passively positioning the second optical element 108 in up to six degrees of freedom. Furthermore, it will be appreciated that instead of the bipods 114, any other suitable connector structures may be provided to support the second optical element 108.

The bipods 111 and the bipods 114 support the first optical element 107 and the second optical element 108 in a manner as described in the International Patent Application Serial No. PCT/EP2005/005600 published as WO 2005/116773 A1 (Kugler et al.), the entire contents of which is incorporated herein by reference. The bipods 111 and the bipods 114 hereby define mutually penetrating first and second installation spaces, respectively, which allow a very compact design of the optical element unit 106 along its optical axis (107.3, 108.3).

Furthermore, the first optical passageway 107.6 and the second optical passageway 108.6 allow a very compact design of the optical element unit 106 transverse to its optical axis (107.3, 108.3), since—despite the structural rigidity of the respective optical element 107, 108—it is not necessary to guide the light on the outside of the first optical element 107 and the second optical element 108.

Thus, in other words, with the invention, a reduction of the necessary installation space of the element unit 106 with respect to conventional designs may be achieved along and transverse to its optical axis (107.3, 108.3).

With the optical element unit 106 as described above a very compact reflecting optical arrangement may be achieved that, when used for example in a catadioptric system, may easily be integrated into a stack of optical element modules to achieve a flush configuration similar to the ones known from conventional refractive optical systems.

In the following a preferred embodiment of a method of manufacturing the first optical element 107 will be described with reference to FIG. 1 to 4.

In a step 116.1 a substantially rotationally symmetric first body is provided including the first optical element body 107. The rotationally symmetric first body in its shape largely corresponds to the shape of the first optical element body 107.1 described above but has a circumferential ring shaped protrusion at its outer circumference. The first body may be manufactured in any suitable manner to provide the above shape.

In a step 116.2, the connecting members 107.9 are formed by machining them from the circumferential ring shaped protrusion from the first body. In a subsequent step 116.3, the reflecting first surface 107.2 is provided by applying a corresponding reflecting coating to the first optical element body 107.1. The reflecting first surface 107.2 includes the Finally, in a step 116.4, the hole forming the first optical passageway 107.6 is formed within the first optical element body 107.1 by suitable means depending on the material of the first optical element body 107.1.

It will be appreciated that this method of manufacturing has the advantage that for most of the time a substantially rotationally symmetric body has to be handled which is greatly alleviating the handling and manufacturing procedures. However, it will be appreciated that, with other embodiments of the invention any other order of the steps 116.2 to 116.4 may be provided when manufacturing the first optical element 107.

With the optical exposure apparatus 101 of FIG. 1 a preferred embodiment of an optical imaging method according to the invention comprising a method of supporting an optical element according to the invention may be executed as it will be described in the following with reference to FIG. 1 to 5.

In a step 117.1, the components of the optical exposure apparatus 101 including the mask 104.1 with a pattern, the substrate 105.1, the optical projection unit 103 adapted to transfer an image of the pattern of the mask 104.1 onto the substrate 105.1 and comprising the optical element unit 106 as well as the illumination unit 102 adapted to illuminate the pattern of the mask 104.1 are provided.

In a step 117.2, the components of the optical exposure apparatus 101 are put into a spatial relation to provide the configuration as it has been described in the context of FIGS. 1 to 3. In particular, in step 117.2, the first optical element 107—that had been previously manufactured according to the steps 116.1 to 116.4 described above—is supported on the support ring 113 of the optical element unit in a statically determinate way via the bipods 111 as it has been described above.

In a step 117.3, the illumination system 102 is then used to illuminate the pattern of the mask 104.1, such that the optical projection unit 103 transfers an image of the pattern of the mask 104.1 onto the substrate 105.1 as it has been described above.

Although, in the foregoing, an embodiment of the invention has been described where in a catadioptric system reflecting elements and refractive have bee combined, it will be appreciated that, with other embodiments of the invention, exclusively reflective or any combinations of reflecting elements with refractive and/or diffractive elements may be used for the optical elements of the optical projection unit.

What is claimed is:

1. An optical element comprising:
    an optical element body;
    a reflecting area; and
    an optical passageway;
    said optical element body defining an axis of rotational symmetry;
    said reflecting area being disposed on said optical element body and adapted to be optically used in an exposure process;
    said optical passageway being arranged within said optical element body and allowing light to pass said optical element body;
    said optical passageway being arranged eccentrically with respect to said axis of rotational symmetry,
    wherein said optical passageway defines a central passageway axis being laterally offset and inclined with respect to said axis of rotational symmetry.

2. The optical element according to claim 1, wherein said optical passageway comprises a recess within said optical element body.

3. The optical element according to claim 1, wherein said optical passageway is formed by a hole within said optical element body.

4. The optical element according to claim 3, wherein
    said hole has an outer circumference;
    said outer circumference of said hole being defined by a continuous circumferential wall section formed within said optical element body.

5. The optical element according to claim 1, wherein said reflecting area is arranged eccentrically with respect to said axis of rotational symmetry.

6. The optical element according to claim 1, wherein
    said reflecting area defines a reflecting area center;
    said reflecting area center being offset with respect to said axis of rotational symmetry.

7. The optical element according to claim 1, wherein said reflecting area forms part of a reflecting section of said optical element body.

8. The optical element according to claim 7, wherein said reflecting section of said optical element body extends over a coherent area of said optical element body being interrupted by said optical passageway.

9. The optical element according to claim 1, wherein said reflecting area is formed by a reflecting surface area of said optical element body.

10. The optical element according to claim 1, wherein
said optical element body has an outer circumference;
at least one connecting member being connected to said outer circumference;
said connecting member being adapted to be connected to a support structure supporting said optical element.

11. The optical element according to claim 10, wherein
said optical element body defines a radial direction;
said at least one connecting member protruding from said optical element body in said radial direction.

12. The optical element according to claim 10, wherein said at least one connecting member is formed monolithically with said optical element body.

13. The optical element according to claim 10, wherein
three connecting members are provided;
said three connecting members being substantially equiangularly distributed at said outer circumference of said optical element body.

14. An optical element unit comprising:
at least one optical element; and
a support structure supporting said at least one optical element;
said at least one optical element comprising an optical element body, a reflecting area and an optical passageway;
said optical element body defining an axis of rotational symmetry;
said reflecting area being disposed on said optical element body and adapted to be optically used in an exposure process;
said optical passageway being arranged within said optical element body and allowing light to pass said optical element body;
said optical passageway being arranged eccentrically with respect to said axis of rotational symmetry,
wherein said optical passageway defines a central passageway axis being laterally offset and inclined with respect to said axis of rotational symmetry.

15. The optical element unit according to claim 14, wherein said support structure supports said at least one optical element in a substantially statically determinate manner.

16. The optical element unit according to claim 14, wherein
said at least one optical element is a first optical element, said optical element body is a first optical element body, said reflecting area is a first reflecting area, said optical passageway is a first optical passageway, said axis of rotational symmetry is a first axis of rotational symmetry, and
at least one second optical element is provided;
said at least one second optical element comprising a second optical element body, a second reflecting area and a second optical passageway;
said second optical element body defining a second axis of rotational symmetry;
said second reflecting area being disposed on said second optical element body and adapted to be optically used in an exposure process;
said second optical passageway being arranged within said second optical element body and allowing light to pass said second optical element body;
said second optical passageway being arranged eccentrically with respect to said second axis of rotational symmetry; and
said support structure supporting said at least one second optical element.

17. The optical element unit according to claim 16, wherein said at least one second optical element is associated to said least one first optical element such that a light beam directed onto said first reflecting area is reflected onto said second reflecting area.

18. The optical element unit according to claim 17, wherein
said light beam propagates along a light beam path;
said first optical element and said second optical element being immediately consecutive optical elements in said light beam path.

19. The optical element unit according to claim 17, wherein said at least one second optical element is associated to said least one first optical element such that said light beam is a light beam reaching said first reflecting area via said second optical passageway.

20. The optical element unit according to claim 17, wherein said at least one second optical element is associated to said least one first optical element such that said light beam traverses said first optical passageway after being reflected by said second reflecting area.

21. The optical element unit according to claim 16, wherein said first axis of rotational symmetry and said second axis of rotational symmetry are substantially collinear.

22. An optical imaging arrangement comprising
a mask unit adapted to receive a pattern;
a substrate unit adapted to receive a substrate;
an optical projection unit adapted to transfer an image of said pattern onto said substrate;
said optical projection unit comprising at least one optical element and a support structure supporting said at least one optical element;
said at least one optical element comprising an optical element body, a reflecting area and an optical passageway;
said optical element body defining an axis of rotational symmetry;
said reflecting area being disposed on said optical element body and adapted to be optically used in an exposure process;
said optical passageway being arranged within said optical element body and allowing light to pass said optical element body; and
said optical passageway being arranged eccentrically with respect to said axis of rotational symmetry,
wherein said optical passageway defines a central passageway axis being laterally offset and inclined with respect to said axis of rotational symmetry.

23. A method of manufacturing an optical element comprising:
providing an optical element body, said optical element body defining an axis of rotational symmetry;
forming a reflecting area of said optical element body, said reflecting area being adapted to be optically used in an exposure process; and
forming an optical passageway, said optical passageway being arranged within said optical element body and allowing light to pass said optical element body, said optical passageway being formed eccentrically with respect to said axis of rotational symmetry, wherein said optical passageway defines a central passageway axis being laterally offset and inclined with respect to said axis of rotational symmetry.

24. The method according to claim 23, wherein said optical passageway is formed subsequent to said reflecting area.

25. The method according to claim 23, wherein said forming an optical passageway comprises forming a recess within said optical element body.

26. The method according to claim 23, wherein said forming an optical passageway comprises forming a hole within said optical element body.

27. The method according to claim 26, wherein said forming a hole comprises forming a continuous circumferential wall section within said optical element body, said continuous circumferential wall section defining an outer circumference of said hole.

28. The method according to claim 23, wherein said reflecting area is arranged eccentrically with respect to said axis of rotational symmetry.

29. The method according to claim 23, wherein
said reflecting area defines a reflecting area center;
said reflecting area center being offset with respect to said axis of rotational symmetry.

30. The method according to claim 23, wherein said reflecting area forms part of a reflecting section of said optical element body.

31. The method according to claim 30, wherein said reflecting section of said optical element body extends over a coherent area of said optical element body being interrupted by said optical passageway.

32. The method according to claim 23, wherein said reflecting area is formed by a reflecting surface area of said optical element body.

33. The method according to claim 23, wherein
said providing said optical element body comprises providing at least one connecting member being connected to an outer circumference of said optical element body;
said connecting member being adapted to be connected to a support structure supporting said optical element.

34. The method according to claim 33, wherein
said optical element body defines a radial direction;
said at least one connecting member protruding from said optical element body in said radial direction.

35. The method according to claim 33, wherein said providing said optical element body comprises forming said at least one connecting member monolithically with said optical element body.

36. The method according to claim 33, wherein
three connecting members are provided;
said three connecting members being substantially equiangularly distributed at said outer circumference of said optical element body.

37. A method of supporting an optical element comprising
providing an optical element having an optical element body, a reflecting area, an optical passageway and at least one connecting member, said optical element body defining an axis of rotational symmetry, said reflecting area being adapted to be optically used in an exposure process, said optical passageway being arranged within said optical element body and allowing light to pass said optical element body, and said optical passageway being formed eccentrically with respect to said axis of rotational symmetry, and
supporting said optical element via said at least one connecting member on a support structure,
wherein said optical passageway defines a central passageway axis being laterally offset and inclined with respect to said axis of rotational symmetry.

38. The method according to claim 37, wherein said optical element is supported in a substantially statically determinate manner.

39. An optical imaging method comprising
providing a pattern, a substrate and an optical projection unit adapted to transfer an image of said pattern onto said substrate, said optical projection unit comprising at least one optical element, said at least one optical element having an optical element body, a reflecting area, an optical passageway and at least one connecting member, said optical element body defining an axis of rotational symmetry, said reflecting area being adapted to be optically used when transferring said image of said pattern onto said substrate, said optical passageway being arranged within said optical element body and allowing light to pass said optical element body, and said optical passageway being formed eccentrically with respect to said axis of rotational symmetry, and
using said optical projection unit to transfer said image of said pattern onto said substrate,
wherein said optical passageway defines a central passageway axis being laterally offset and inclined with respect to said axis of rotational symmetry.

40. The optical imaging method according to claim 39, wherein
said at least one optical element is a first optical element, said optical element body is a first optical element body, said reflecting area is a first reflecting area, said optical passageway is a first optical passageway, said axis of rotational symmetry is a first axis of rotational symmetry, and
at least one second optical element is provided as a part of said optical projection unit, said at least one second optical element comprising a second optical element body, a second reflecting area and a second optical passageway, said second optical element body defining a second axis of rotational symmetry, said second reflecting area being disposed on said second optical element body and adapted to be optically used when transferring said image of said pattern onto said substrate, said second optical passageway being arranged within said second optical element body and allowing light to pass said second optical element body, said second optical passageway being arranged eccentrically with respect to said second axis of rotational symmetry.

41. The optical imaging method according to claim 40, wherein
a light beam is used to transfer said image of said pattern onto said substrate;
said light beam being directed onto said first reflecting area;
said at least one second optical element being associated to said least one first optical element such that said light beam is reflected from said first reflecting area onto said second reflecting area.

42. The optical imaging method according to claim 41, wherein
said light beam propagates along a light beam path;
said first optical element and said second optical element being immediately consecutive optical elements in said light beam path.

43. The optical imaging method according to claim 42, wherein said at least one second optical element is associated to said least one first optical element such that said light beam reaches said first reflecting area via said second optical passageway.

44. The optical imaging method according to claim 42, wherein said at least one second optical element is associated to said least one first optical element such that said light beam traverses said first optical passageway after being reflected by said second reflecting area.

45. The optical imaging method according to claim 41, wherein said first axis of rotational symmetry and said second axis of rotational symmetry are substantially collinear.

46. An optical imaging method comprising
providing a pattern, a substrate and an optical projection unit adapted to transfer an image of said pattern onto said substrate; and
using a light beam to transfer said image of said pattern onto said substrate;
wherein said using said light beam comprises directing said light beam onto an eccentric first reflecting area of a first optical element of said optical projection unit, said first reflecting area reflecting said light beam onto an eccentric second reflecting area of a second optical element of said optical projection unit,
wherein said directing said light beam onto said first reflecting area comprises directing said light beam through an eccentric optical passageway of said second optical element, and
wherein said second optical element defines an axis of rotational symmetry, and said optical passageway defines a central passageway axis being laterally offset and inclined with respect to said axis of rotational symmetry.

47. The optical imaging method according to claim 46, wherein
said light beam propagates along a light beam path;
said first optical element and said second optical element being immediately consecutive optical elements in said light beam path.

48. The optical imaging method according to claim 46, wherein said light beam is reflected from said second reflecting area and traverses an eccentric optical passageway of said first optical element.

49. An optical element unit comprising:
a first optical element;
a second optical element; and
a support structure supporting said first optical element adjacent to said second optical element;
said first optical element comprising a first optical element body, a first reflecting area and a first optical passageway;
said second optical element comprising a second optical element body, a second reflecting area and a second optical passageway;
said first optical element body defining a first axis of rotational symmetry;
said second optical element body defining a second axis of rotational symmetry;
said first reflecting area being disposed on said first optical element body and adapted to be optically used in an exposure process;
said second reflecting area being disposed on said second optical element body and adapted to be optically used in an exposure process;
said first optical passageway being arranged within said first optical element body and allowing light to pass said first optical element body;
said second optical passageway being arranged within said second optical element body and allowing light to pass said second optical element body;
said first optical passageway being arranged eccentrically with respect to said first axis of rotational symmetry;
said second optical passageway being arranged eccentrically with respect to said second axis of rotational symmetry,
wherein said first optical passageway defines a first central passageway axis being laterally offset and inclined with respect to said first axis of rotational symmetry, and
wherein said second optical passageway defines a second central passageway axis being laterally offset and inclined with respect to said second axis of rotational symmetry.

50. The optical element of claim 49, wherein said second optical element is associated to said first optical element such that a light beam directed onto said first reflecting area is reflected onto said second reflecting area.

51. The optical element unit according to claim 50, wherein said light beam propagates along a light beam path;
said first optical element and said second optical element being immediately consecutive optical elements in said light beam path.

52. The optical element unit according to claim 50, wherein said at least one second optical element is associated to said least one first optical element such that said light beam is a light beam reaching said first reflecting area via said second optical passageway.

53. The optical element unit according to claim 50, wherein said at least one second optical element is associated to said least one first optical element such that said light beam traverses said first optical passageway after being reflected by said second reflecting area.

54. The optical element unit according to claim 49, wherein said first axis of rotational symmetry and said second axis of rotational symmetry are substantially collinear.

55. An optical element unit comprising:
a first optical element;
a second optical element; and
a support structure;
said first optical element comprising a first reflecting area and an eccentric first optical passageway;
said second optical element comprising a second reflecting area and an eccentric second optical passageway;
said support structure supporting said first optical element adjacent to said second optical element such that said first reflecting area faces said second reflecting area with an intermediate space being formed between said first optical element and said second optical element;
said support structure supporting said first optical element via first connectors and said second optical element via second connectors such that said first connectors and said second connectors define mutually penetrating first and second installation spaces;
said first optical passageway allowing light to enter said intermediate space and said second optical passageway allowing light to leave said intermediate space,
wherein said first optical passageway defines a first central passageway axis being laterally offset and inclined with respect to said first axis of rotational symmetry, and
wherein said second optical passageway defines a second central passageway axis being laterally offset and inclined with respect to said second axis of rotational symmetry.

* * * * *